United States Patent
Kitagawa

(10) Patent No.: US 11,849,591 B2
(45) Date of Patent: Dec. 19, 2023

(54) POWER GATING IN A MEMORY DEVICE

(71) Applicant: Micron Technology, Inc., Boise, ID (US)

(72) Inventor: Makoto Kitagawa, Folsom, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 18/053,966

(22) Filed: Nov. 9, 2022

(65) Prior Publication Data

US 2023/0113576 A1 Apr. 13, 2023

Related U.S. Application Data

(63) Continuation of application No. 17/112,776, filed on Dec. 4, 2020, now Pat. No. 11,521,979.

(51) Int. Cl.
*G11C 11/22* (2006.01)
*H10B 53/30* (2023.01)
*H01L 29/786* (2006.01)
*H10B 53/40* (2023.01)

(52) U.S. Cl.
CPC ........... *H10B 53/30* (2023.02); *G11C 11/221* (2013.01); *G11C 11/2259* (2013.01); *H01L 29/7869* (2013.01); *H10B 53/40* (2023.02)

(58) Field of Classification Search
CPC ...... H10B 53/30; H10B 53/40; G11C 11/221; G11C 11/2259; H01L 29/7869
USPC .......................................................... 365/145
See application file for complete search history.

(56) References Cited

U.S. PATENT DOCUMENTS

| | | | |
|---|---|---|---|
| 5,574,679 A | 11/1996 | Ohtsuki et al. | |
| 6,310,797 B1* | 10/2001 | Muneno | G11C 11/22 365/145 |
| 6,504,748 B2* | 1/2003 | Choi | G11C 11/22 365/189.09 |
| 7,372,765 B2 | 5/2008 | Hardee | |
| 9,026,808 B2 | 5/2015 | Yang et al. | |
| 9,721,638 B1* | 8/2017 | Kawamura | G11C 11/2275 |
| 9,786,349 B1* | 10/2017 | Calderoni | G11C 11/2257 |
| 10,043,566 B2* | 8/2018 | Ingalls | G11C 11/2275 |
| 10,074,415 B2* | 9/2018 | Kawamura | G11C 11/221 |
| 10,083,732 B2* | 9/2018 | Calderoni | G11C 11/2273 |

(Continued)

OTHER PUBLICATIONS

"International Search Report and Written Opinion of the International Searching Authority," issued in connection with Int'l Appl. No. PCT/US21/72597, dated Apr. 1, 2022 (11 pages).

*Primary Examiner* — Viet Q Nguyen
(74) *Attorney, Agent, or Firm* — Holland & Hart LLP

(57) ABSTRACT

Methods, systems, and devices for power gating in a memory device are described for using one or more memory cells as drivers for load circuits of a memory device. A group of memory cells of the memory device may represent memory cells that include a switching component and that omit a memory storage element. These memory cells may be coupled with respective plate lines that may be coupled with a voltage source having a first supply voltage. Each memory cell of the group may also be coupled with a respective digit line that may be coupled with the load circuits. Respective switching components of the group of memory cells may therefore act as drivers to apply the first supply voltage to one or more load circuits by coupling a digit line with a plate line having the first supply voltage.

20 Claims, 6 Drawing Sheets

(56) References Cited

U.S. PATENT DOCUMENTS

| | | | |
|---|---|---|---|
| 10,600,468 B2* | 3/2020 | Pan | G11C 11/2255 |
| 10,748,596 B2* | 8/2020 | Ingalls | G11C 11/221 |
| 11,062,753 B2* | 7/2021 | Ingalls | G11C 11/2273 |
| 2010/0165703 A1 | 7/2010 | Matano | |
| 2020/0118602 A1 | 4/2020 | Yang et al. | |
| 2020/0328746 A1 | 10/2020 | Park et al. | |

\* cited by examiner

POWER GATING IN A MEMORY DEVICE

CROSS REFERENCES

The present Application for Patent is a continuation of U.S. patent application Ser. No. 17/112,776 by Kitagawa, et al., entitled "POWER GATING IN A MEMORY DEVICE", filed Dec. 4, 2020, which is assigned to the assignee hereof, and which is expressly incorporated by reference in its entirety herein.

FIELD OF TECHNOLOGY

The following relates generally to one or more systems for memory and more specifically to power gating in a memory device.

BACKGROUND

Memory devices are widely used to store information in various electronic devices such as computers, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source. FeRAM may be able to achieve densities similar to volatile memory but may have non-volatile properties due to the use of a ferroelectric capacitor as a storage device.

DETAILED DESCRIPTION

Figure 1:
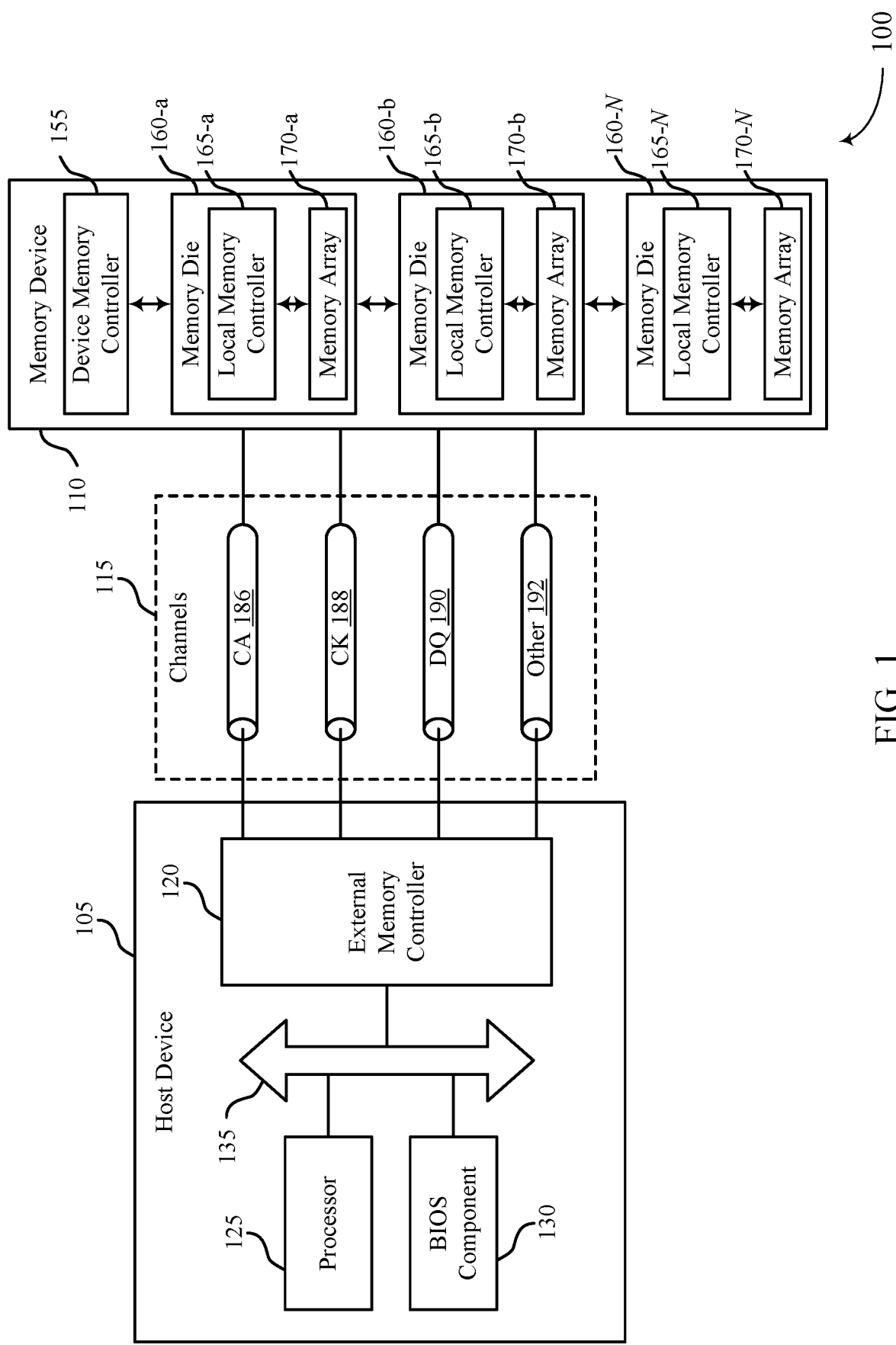
FIG. 1 illustrates an example of a system that supports power gating in a memory device in accordance with examples as disclosed herein.

A memory device may include multiple load circuits, and in some examples, one or more drivers for activating the load circuits. A load circuit may be configured to supply power (e.g., a voltage, a current) to one or more components of the memory device, such as a decoder, a sense component (e.g., a sense amplifier), or a generator, among other examples. A load circuit may be configured to receive a first supply voltage (e.g., a negative supply terminal voltage, a peripheral circuitry voltage) and apply a second supply voltage (e.g., a larger supply voltage relative to the first supply voltage) to the one or more components of the memory device. In some examples, the first supply voltage may be applied to a load circuit via a driver for the load circuit, where the driver may include a switching component (e.g., a transistor) for coupling the load circuit with a voltage source having the first supply voltage. Applying or restricting a voltage (e.g., the first supply voltage) to a circuit via a driver (e.g., a transistor) may be referred to herein as power gating, among other examples. In some examples, a driver for a load circuit may take up a relatively large amount of space compared to the load circuit. The space taken up by one or more drivers for the load circuits of the memory device may in some examples increase a size of the memory device, a cost of manufacturing the memory device, or both, among other disadvantages.

The present disclosure provides techniques for using one or more memory cells as one or more drivers for one or more load circuits. A first group of memory cells (e.g., one or more memory cells) of the memory device may be configured to store one or more logic states for memory storage (e.g., data storage). A second group of memory cells (e.g., one or more memory cells) of the memory device may include memory cells that include a switching component and that omit a storage component (e.g., a memory storage element). Memory cells of the second group may each be coupled with a respective plate line that may be coupled with a voltage source having the first supply voltage. Memory cells of the second group may also each be coupled with a respective digit line that may be coupled with one or more load circuits. As such, respective switching components of the second group of memory cells may act as a respective driver to couple the voltage source having the first supply voltage with one or more load circuits. For example, one or more switching components of the second group of memory cells may be activated to couple one or more load circuits with the voltage source (e.g., by coupling a digit line with a plate line). Advantageously when the second group of memory cells are used as one or more drivers for the load circuits of the memory device, other drivers may, in some examples, be omitted from the memory device. Doing so may save space in the memory device (e.g., decrease a device size, increase a device storage density) and may decrease production and other costs associated with the memory device, among other advantages.

Features of the disclosure are initially described in the context of systems and dies as described with reference to FIGS. 1-2. Features of the disclosure are described in the context of a device architecture and circuit diagrams as described with reference to FIGS. 3-4. These and other features of the disclosure are further illustrated by and described with reference to an apparatus diagram and flowcharts that relate to power gating in a memory device as described with reference to FIGS. 5-6.

Figure 2:
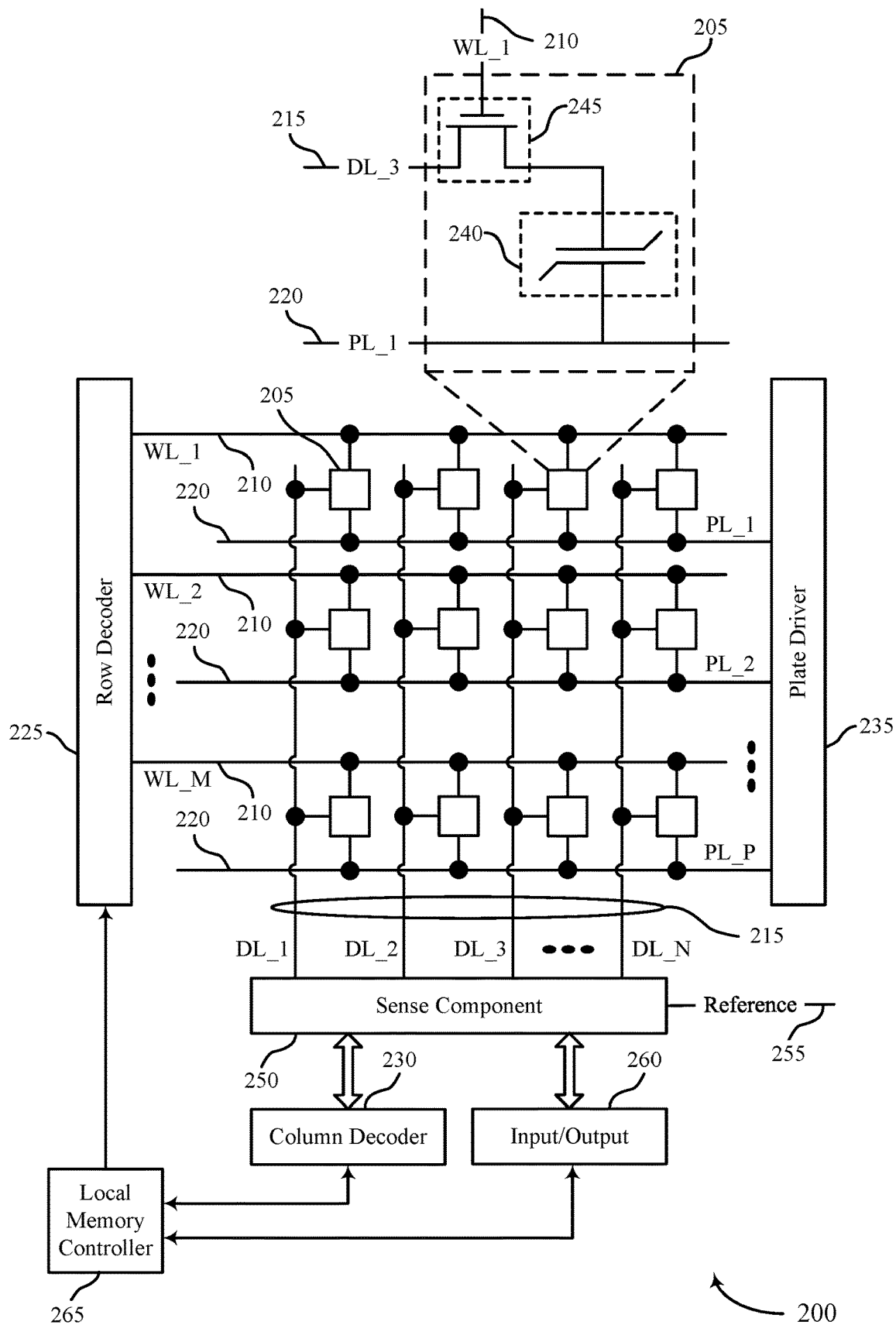
FIG. 2 illustrates an example of a memory die that supports power gating in a memory device in accordance with examples as disclosed herein.

FIG. 1 illustrates an example of a system 100 that supports power gating in a memory device in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. In some examples, memory cells within an array may be grouped into two or more groups of memory cells, for example, where each group of memory cells may share one or more characteristics. A memory device 110 including two or more memory dies may be referred to as a multi-die memory or a multi-die package or a multi-chip memory or a multi-chip package.

The memory die 160 may be an example of a two-dimensional (2D) array of memory cells or may be an example of a three-dimensional (3D) array of memory cells. A 2D memory die 160 may include a single memory array 170. A 3D memory die 160 may include two or more memory arrays 170, which may be stacked on top of one another or positioned next to one another (e.g., relative to a substrate). In some examples, memory arrays 170 in a 3D memory die 160 may be referred to as decks, levels, layers, or dies. A 3D memory dies 160 may include any quantity of stacked memory arrays 170 (e.g., two high, three high, four high, five high, six high, seven high, eight high). In some 3D memory dies 160, different decks may share at least one common access line such that some decks may share one or more of a word line, a digit line, or a plate line. In some examples, different layers or decks of 3D memory arrays may be processed in a similar manner to produce similar memory cells, and in some examples, different layers or decks may be processed in a different manner to produce different memory cells.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

A memory cell may, in some examples, be configured and used as a driver for one or more load circuits of a memory device 110. For example, a first group of memory cells (e.g., one or more memory cells) of the memory device 110 may be configured to store one or more logic states for memory storage (e.g., data storage). A second group of memory cells (e.g., one or more memory cells) of the memory device 110 may include memory cells that include a switching component and that omit a storage component. Memory cells of the second group may each be coupled with a respective access line (e.g., plate line) that may be coupled with a voltage source having a first supply voltage and may each be coupled with a respective second access line (e.g., digit line) that may be coupled with one or more load circuits. As such, respective switching components of the second group of memory cells may be configured to act as drivers to couple the voltage source having the first supply voltage with one or more load circuits. When the second group of memory cells are configured as one or more drivers for the load circuits of the memory device 110, other drivers may, in some examples, be omitted from the memory device. Doing so may save space in the memory device 110 (e.g., decrease a device size, increase a device storage density) and may decrease production and other costs associated with the memory device 110, among other advantages FIG. 2 illustrates an example of a memory die 200 that supports power gating in a memory device in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a state (e.g., polarization state or dielectric charge) representative of the programmable states in a capacitor. In FeRAM architectures, the memory cell 205 may include a capacitor 240 that includes a ferroelectric material to store a charge and/or a polarization representative of the programmable state. The memory cell 205 may include a logic storage component, such as capacitor 240, and a switching component 245. The capacitor 240 may be an example of a ferroelectric capacitor. A first node of the capacitor 240 may be coupled with the switching component 245 and a second node of the capacitor 240 may be coupled with a plate line 220. The switching component 245 may be an example of a transistor or any other type of switch device that selectively establishes or de-establishes electronic communication between two components.

The memory die 200 may include access lines (e.g., the word lines 210, the digit lines 215, and the plate lines 220) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, bit lines, or plate lines, or their analogues, are interchangeable without loss of understanding or operation. Memory cells 205 may be positioned at intersections of the word lines 210, the digit lines 215, and/or the plate lines 220.

Operations such as reading and writing may be performed on memory cells 205 by activating or selecting access lines such as a word line 210, a digit line 215, and/or a plate line 220. By biasing a word line 210, a digit line 215, and a plate line 220 (e.g., applying a voltage to the word line 210, digit line 215, or plate line 220), a single memory cell 205 may be accessed at their intersection. Activating or selecting a word line 210, a digit line 215, or a plate line 220 may include applying a voltage to the respective line.

Accessing the memory cells 205 may be controlled through a row decoder 225, a column decoder 230, and a plate driver 235. For example, a row decoder 225 may receive a row address from the local memory controller 265 and activate a word line 210 based on the received row address. A column decoder 230 receives a column address from the local memory controller 265 and activates a digit line 215 based on the received column address. A plate driver 235 may receive a plate address from the local memory controller 265 and activates a plate line 220 based on the received plate address.

Selecting or deselecting the memory cell 205 may be accomplished by activating or deactivating the switching component 245. The capacitor 240 may be in electronic communication with the digit line 215 using the switching component 245. For example, the capacitor 240 may be isolated from digit line 215 when the switching component 245 is deactivated, and the capacitor 240 may be coupled with digit line 215 when the switching component 245 is activated.

A word line 210 may be a conductive line in electronic communication with a memory cell 205 that is used to perform access operations on the memory cell 205. In some architectures, the word line 210 may be in electronic communication with a gate of a switching component 245 of a memory cell 205 and may be operable to control the switching component 245 of the memory cell. In some architectures, the word line 210 may be in electronic communication with a node of the capacitor of the memory cell 205 and the memory cell 205 may not include a switching component.

A digit line 215 may be a conductive line that connects the memory cell 205 with a sense component 250. In some architectures, the memory cell 205 may be selectively coupled with the digit line 215 during portions of an access operation. For example, the word line 210 and the switching component 245 of the memory cell 205 may be operable to selectively couple and/or isolate the capacitor 240 of the memory cell 205 and the digit line 215. In some architectures, the memory cell 205 may be in electronic communication (e.g., constant) with the digit line 215.

A plate line 220 may be a conductive line in electronic communication with a memory cell 205 that is used to perform access operations on the memory cell 205. The plate line 220 may be in electronic communication with a node (e.g., the cell bottom) of the capacitor 240. The plate line 220 may cooperate with the digit line 215 to bias the capacitor 240 during access operation of the memory cell 205.

The sense component 250 may determine a state (e.g., a polarization state or a charge) stored on the capacitor 240 of the memory cell 205 and determine a logic state of the memory cell 205 based on the detected state. The sense component 250 may include one or more sense amplifiers to amplify the signal output of the memory cell 205. The sense component 250 may compare the signal received from the memory cell 205 across the digit line 215 to a reference 255 (e.g., a reference voltage). The detected logic state of the memory cell 205 may be provided as an output of the sense component 250 (e.g., to an input/output 260), and may indicate the detected logic state to another component of a memory device 110 that includes the memory die 200.

The local memory controller 265 may control the operation of memory cells 205 through the various components (e.g., row decoder 225, column decoder 230, plate driver 235, and sense component 250). The local memory controller 265 may be an example of the local memory controller 165 described with reference to FIG. 1. In some examples, one or more of the row decoder 225, column decoder 230, and plate driver 235, and sense component 250 may be co-located with the local memory controller 265. The local memory controller 265 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 265 may generate row signals and column address signals to activate the target word line 210, the target digit line 215, and the target plate line 220. The local memory controller 265 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 265 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 265 in response to various access commands (e.g., from a host device 105). The local memory controller 265 may be operable to perform other access operations not listed here or other operations related to the operating of the memory die 200 that are not directly related to accessing the memory cells 205.

A memory cell 205 may, in some examples, be configured as and used as a driver for one or more load circuits associated with a memory die 200 (or a memory device). For example, a first group of memory cells 205 (e.g., one or more memory cells) of the memory device may be configured to store logic states for memory storage (e.g., data storage). A second group of memory cells 205 (e.g., one or more memory cells) of the memory device may represent memory cells that include a switching component 245 and that omit a storage component (e.g., a capacitor 240). Memory cells 205 of the second group may be coupled (e.g., each be coupled) with a respective access line (e.g., plate line 220) that may be coupled with a voltage source having a first supply voltage, and may be coupled (e.g., each be coupled) with a respective second access lien (e.g., digit line 215) that may be coupled with one or more load circuits. As such, respective switching components 245 of the second group of memory cells 205 may act as drivers to couple the voltage source having the first supply voltage with one or more load circuits.

Figure 3:
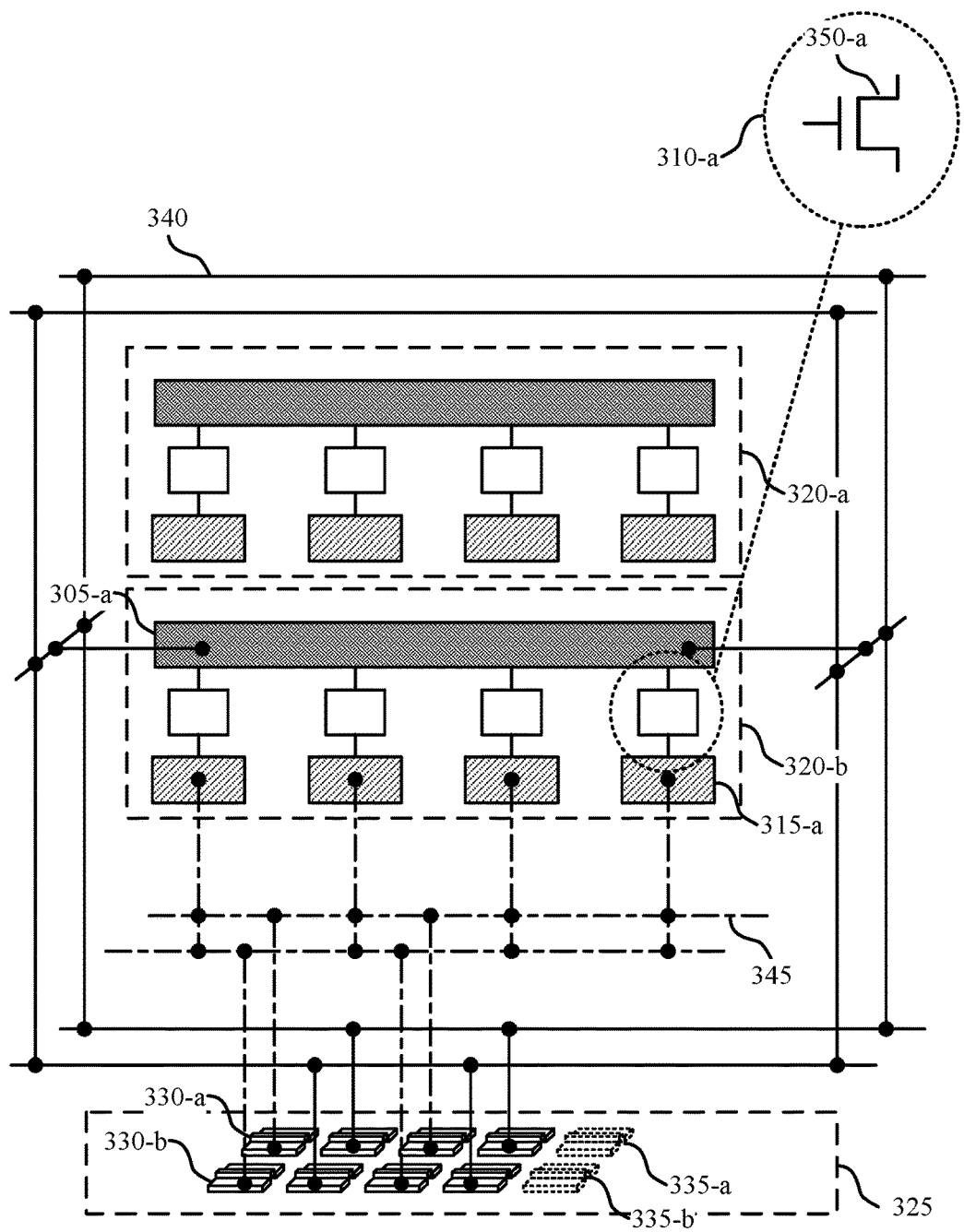
FIG. 3 illustrates an example of a device architecture that supports power gating in a memory device in accordance with examples as disclosed herein.

FIG. 3 illustrates an example of a device architecture 300 that supports power gating in a memory device in accordance with examples as disclosed herein. Device architecture 300 may show a structure of one or more memory arrays within a memory device, as described with reference to FIGS. 1 and 2. For example, device architecture 300 may include multiple memory cells 310, where the memory cells 310 may be included in one of two groups 320 of memory cells 310 within the memory device. Each memory cell may be associated with a respective plate line 305 and a respective digit line 315, where the plate line 305 and the digit line 315 may be shared by multiple memory cells 310 in some examples. Each memory cell may include a switching component 350 (e.g., a transistor), which may be configured to be activated by a respective word line (e.g., coupled with a gate of the switching component 350). The word line may activate the switching component 350 to couple the memory cell 310 with the digit line 315. In the example illustrated herein, the digit lines 315 may be oriented to extend in and out of the page, for example, to other memory cells 310 of the memory device.

The memory device may include a metal oxide semiconductor (MOS) layer 325 (e.g., a complementary MOS (CMOS) layer, such as a planar CMOS). The MOS layer 325 may, in some examples, be located beneath the memory cells 310 (e.g., beneath a memory cell array, such as a 3D memory array) to reduce a chip area of the memory array. In some examples, the MOS layer 325 may extend beyond an area covered by the memory array, such as extending into an edge area or peripheral area of the memory device (e.g., of the chip). The peripheral area may be close to or adjacent to one or more pins or pads of the memory device, such as one or more DQ pins or CA pins. The memory array may not be located over (e.g., may not cover) the MOS layer 325 in the peripheral area, for example, based on performance of peripheral circuitry. For example, circuitry supporting the memory array (e.g., sense amplifiers, decoders, drivers) may block some routing for peripheral circuitry if the memory array is located in the peripheral area, which may result in reduced performance of the peripheral circuitry.

The MOS layer 325 may include multiple load circuits 330, and in some examples, one or more drivers 335 for the load circuits 330. A load circuit 330 may be configured to supply power (e.g., a voltage or a current) to one or more components of the memory device, such as a decoder, a sense amplifier (e.g., a sense component), or a generator, among other examples. A load circuit 330 may be configured to receive a first supply voltage (e.g., a negative supply terminal voltage or a peripheral circuitry voltage) and apply a second supply voltage (e.g., a larger supply voltage relative to the first supply voltage) to the one or more components of the memory device.

Each load circuit 330 may include multiple switching components 350, which may be coupled with one another in a configuration to support receiving the first supply voltage and converting the first supply voltage to the second supply voltage. For example, the multiple switching components 350 may be arranged in a footer power gating scheme (e.g., to reduce standby current), where switching components 350 may be coupled in pairs of one p-type MOS (PMOS) switching component 350 (e.g., PMOS transistor) and one n-type MOS (NMOS) switching component 350 (e.g., NMOS transistor). In such configurations, a gate of each NMOS transistor and a gate of each respective PMOS transistor may be coupled together, and a drain (e.g., a first terminal) of each NMOS transistor may be coupled with a source (e.g., a second terminal) of each respective PMOS transistor. The sources of each NMOS transistor may be coupled together and may each be couplable with the first supply voltage (e.g., via a driver 335), and the drains of each PMOS transistor may be coupled together and may be coupled with a different voltage (e.g., a peripheral component voltage).

In some examples, the first supply voltage may be applied to a load circuit 330 via a driver 335 for the load circuit 330, where the driver 335 may include a switching component 350 (e.g., a transistor). For example, in a first mode such as a standby mode (e.g., when a load circuit 330 is unpowered), a driver 335 associated with the load circuit 330 may be inactive, which may limit or restrict leakage, current, or voltage application to the associated load circuit 330. In such cases, the load circuits 330 may experience a voltage, such as a standby or inactive voltage (e.g., based on a configuration of the multiple switching components 350). In a second mode, which is different than the first mode, such as an active mode (e.g., when a load circuit 330 is powered), a driver 335 associated with the load circuit 330 may be active, which may result in application of the first supply voltage to the associated load circuit 330. In such cases, the standby or inactive voltage may be adjusted toward the first supply voltage using the driver 335 (e.g., by shorting the load circuit 330 with a voltage source having the first supply voltage), and may thereby be brought to a same voltage level as the first supply voltage.

In some implementations, a driver 335 for a load circuit 330 may take up a relatively large amount of space compared with the load circuit 330. For example, the driver 335 may take up one fourth of the area of the load circuit 330, which may represent 20 percent of a combined area of the load circuit 330 and driver 335. The area taken up by the drivers 335 for the load circuits 330 may increase a size of the memory device, a cost of manufacturing the memory device, or both, among other disadvantages.

The present disclosure in contrast provides techniques for using one or more memory cells 310 as one or more drivers for one or more of the load circuits 330. A first group 320-a of memory cells 310 of the memory device may be configured to store logic states for memory storage (e.g., data storage). A second group 320-*b* of memory cells 310 of the memory device may represent memory cells 310 that include a switching component 350, without including a memory storage element (e.g., omitting a memory storage element). For example, the second group 320-*b* of memory cells 310 may include memory cells 310 such as memory cell 310-*a*, which may include switching component 350-*a* (e.g., a thin film transistor (TFT)) and may omit a memory storage element. In some examples, the second group 320-*b* may include a smaller quantity of memory cells 310 than the first group 320-*a*. Memory cells 310 of the second group 320-*b* may be coupled (e.g., may each be coupled) with a respective plate line 305 (e.g., plate line 305-*a*) that may be coupled with a voltage source having the first supply voltage, such as via circuitry 340 (e.g., one or more first electrode lines). Memory cells 310 of the second group 320-*b* may also be coupled (e.g., may each be coupled) with a respective digit line 315 (e.g., digit line 315-*a*) that may be coupled with one or more load circuits 330, such as via circuitry 345 (e.g., one or more second electrode lines).

As such, respective switching components 350 of the second group 320-*b* of memory cells 310 may act as a respective driver to couple the voltage source having the first supply voltage with one or more load circuits 330. For example, one or more switching components 350 of the second group 320-*b* of memory cells 310 may be activated to couple one or more load circuits 330 with the voltage source (e.g., by coupling a digit line 315 with a plate line 305, and thereby coupling circuitry 345 with circuitry 340). In some examples, one memory cell 310 may act as a driver for one load circuit 330, or may act as a driver for multiple load circuits 330 (e.g., depending on a configuration of circuitry 345). In some examples, multiple memory cells 310 may be activated concurrently (e.g., at least partially overlapping) to activate one load circuit 330, or to activate multiple load circuits 330. In some examples, a supply voltage (e.g., the first supply voltage or another supply voltage) may be applied to portions of one or more load circuits 330, for example, without using a switching component 350, such as using a direct connection via circuitry 340.

When the second group 320-*b* of memory cells 310 are configured as drivers for the load circuits 330 of the memory device, the drivers 335 of the MOS layer 325 that would otherwise be included may, in some examples, be omitted from the memory device. Doing so may save space in the memory device (e.g., decrease a device size or increase a device storage density) and may decrease production and other costs associated with the memory device, among other advantages.

In some examples, the second group 320-*b* of memory cells 310 (e.g., at least some of the second group 320-*b* of memory cells 310 or all of the second group 320-*b* of memory cells 310) may be included in a peripheral area of the memory device (e.g., above the MOS layer 325). Doing so may minimize an effect on available memory storage at the memory device while failing to interfere with peripheral circuitry (e.g., because supporting circuitry may not be implemented for the second group of memory cells 310, based on each of the second group of memory cells 310 omitting a memory storage element). In some examples, some of the second group 320-*b* of memory cells 310 may be included in the peripheral area of the memory device and some of the second group 320-*b* of memory cells 310 (e.g., a remainder of second group 320-*b* of memory cells 310) may be included in other areas of the memory device (e.g., a memory storage area, associated with the first group 320-*a* of memory cells 310). In some examples, the second group 320-*b* of memory cells 310 may be included in a lower layer or deck of memory cells 310 within a 3D array of the memory device (e.g., some or all of a lower layer of memory cells 310). In such cases, some or all of the first group 320-*a* of memory cells 310 may be included in an upper layer or deck of memory cells 310. In some examples, the lower deck or layer of memory cells 310 may include some memory cells 310 of the first group 320-*a* and some memory cells 310 of the second group 320-*b*. In some examples, the second group 320-*b* of memory cells 310 may be included in multiple layers or decks of memory cells 310 (e.g., in a peripheral area).

When manufacturing the memory device, the second group 320-*b* of memory cells 310 may be processed to remove associated memory storage elements. Additionally or alternatively, the second group 320-*b* of memory cells 310 may be processed differently from other memory cells 310, for example, such that the second group 320-*b* of memory cells 310 may not have memory storage components included during any stage of the manufacturing process.

Figure 4A:
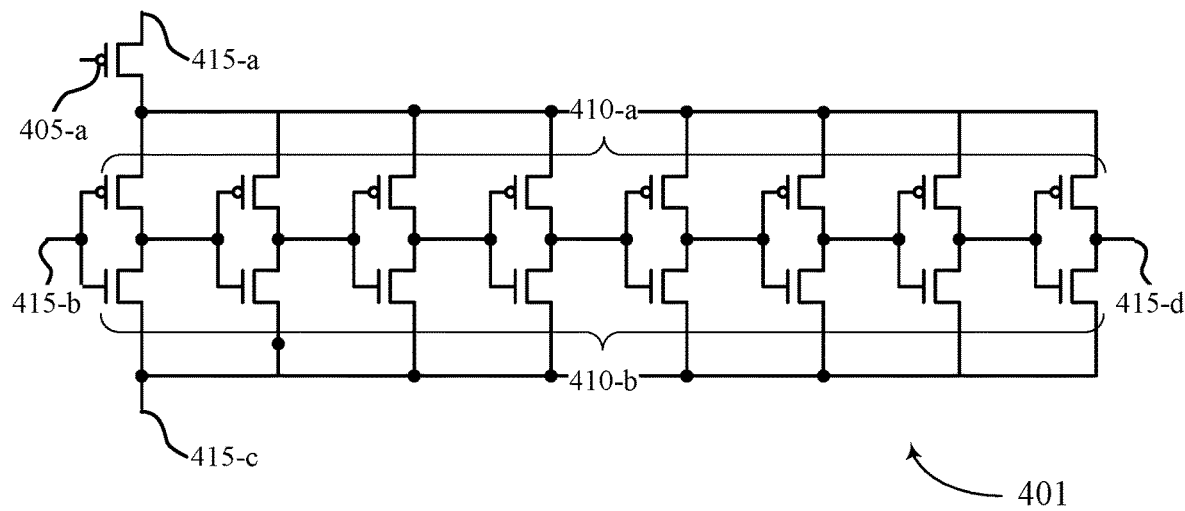
FIGS. 4A, 4B, and 4C illustrate examples of circuit diagrams that support power gating in a memory device in accordance with examples as disclosed herein.
Figure 4B:
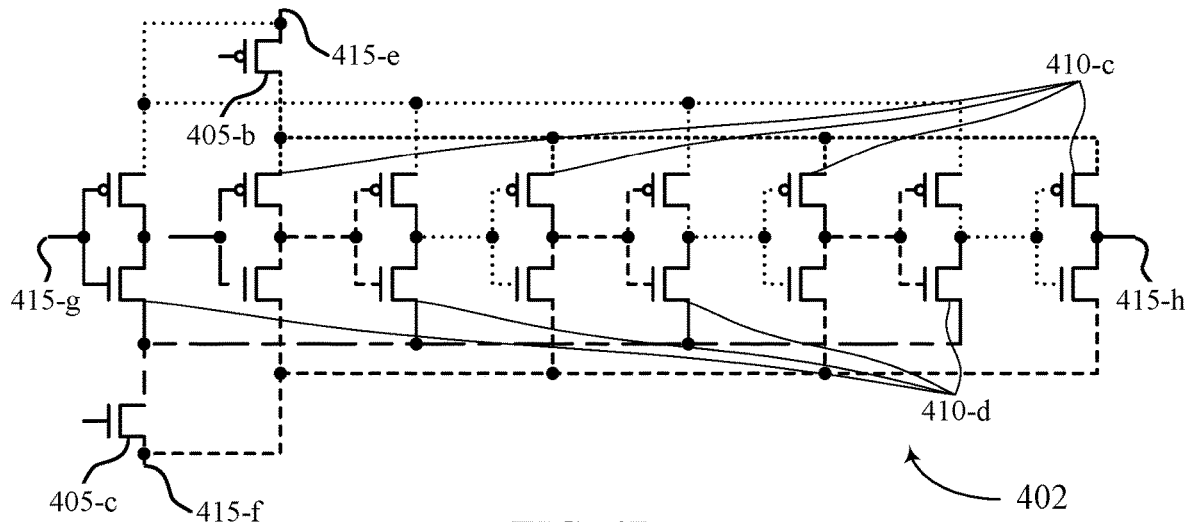
Figure 4C:
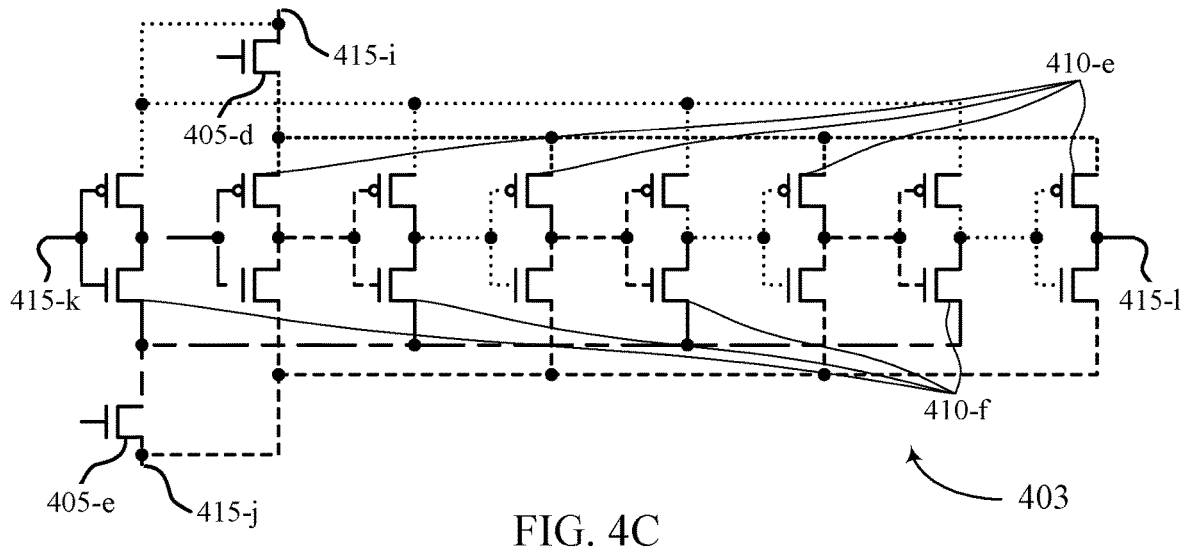

FIGS. 4A, 4B, and 4C illustrate examples of circuit diagrams 401, 402, and 403 that support power gating in a memory device in accordance with examples as disclosed herein. Circuit diagrams 401, 402, and 403 may each represent a respective example of a load circuit as described with reference to FIG. 3. For example, different load circuit configurations illustrated by circuit diagrams 401, 402, and 403 may be used within a memory device based on, among other aspects, a type of TFT used for memory cells of a memory device (e.g., used for a switching component 405 of the memory cells). As described with reference to FIG. 3, a group of memory cells of the memory device may be used as respective drivers (e.g., transistors) for respective load circuits, where the group of memory cells may each include a respective switching component 405 (e.g., a TFT) and may omit a respective storage component (e.g., memory storage element). The load circuits illustrated by circuit diagrams 401, 402, and 403 may include multiple switching components 410, which may be configured, for example, to receive a first supply voltage via the driver and apply a second supply voltage to one or more components of the memory device.

In some examples, the switching components 405 of the group of memory cells may be configured as PMOS TFTs (e.g., during a manufacturing process). In such cases, the memory device may be configured with load circuits similar to the load circuit illustrated by circuit diagram 401. In some examples, switching components 405 of a first subset of the group of memory cells may be configured as PMOS TFTs and the switching components 405 of a second subset of the group of memory cells may be configured as NMOS TFTs. In such cases, the memory device may be configured with load circuits similar to the load circuit illustrated by circuit diagram 402. In some examples, the switching components 405 of the group of memory cells may be configured as NMOS TFTs. In such cases, the memory device may be configured with load circuits similar to the load circuit illustrated by circuit diagram 403.

Circuit diagram 401 related to FIG. 4A may represent a power gating scheme that may be referred to as a header scheme. A switching component 405-*a* of the group of memory cells may be configured and used as a driver for the load circuit represented by circuit diagram 401, where switching component 405-*a* may represent a PMOS TFT. In the example illustrated by circuit diagram 401, the first supply voltage may be applied to a first terminal of switching component 405-*a* (e.g., at node 415-*a*), for example, via a plate line as described with reference to FIG. 3. If switching component 405-*a* is activated (e.g., via a word line) the first supply voltage may be applied to respective first terminals (e.g., drains) of a first set of switching components 410-*a* of the load circuit (e.g., PMOS transistors). In the example illustrated by circuit diagram 401, the first supply voltage may represent a voltage for peripheral circuitry of the memory device.

A third supply voltage may be applied (e.g., without the use of drivers, or in a standby state) to nodes 415-*b* and 415-*c* of circuit diagram 401, where the third supply voltage may represent a negative supply terminal voltage. As such, the third supply voltage may be applied to respective second terminals (e.g., sources) of a second set of switching components 410-*b* (e.g., NMOS transistors). A second terminal (e.g., source) of each of the first set of switching components 410-*a* may be coupled with a respective first terminal (e.g., drain) of a respective switching component 410-*b*, and the first and second terminals that are coupled together may also be coupled with a respective gate of each of a following pair of switching components 410-*a* and 410-*b* (e.g., as illustrated in FIG. 4A).

Accordingly, the load circuit illustrated by circuit diagram 401 may be configured to receive the first supply voltage via switching component 405-*a* and apply the second supply voltage at a node 415-*d* of the load circuit. Node 415-*d* may be coupled with one or more components of the memory device, for example, to apply the second supply voltage to the one or more components.

Circuit diagram 402 related to FIG. 4B may represent a power gating scheme that may be referred to as a subthreshold current reduction circuit (SCRC) scheme. A switching component 405-*b* of the first subset of the group of memory cells may be configured and used as a first driver for the load circuit represented by circuit diagram 402, and a switching component 405-*c* of the second subset of the group of memory cells may be configured and used as a second driver for the load circuit. Switching component 405-*b* may represent a PMOS TFT and switching component 405-*c* may represent an NMOS TFT. For example, a top deck of the group of memory cells may be configured as PMOS TFTs to produce the first subset of the group and a bottom deck of the group of memory cells may be configured as NMOS TFTs to produce the second subset of the group.

The first supply voltage may be applied to a first terminal of switching component 405-*b* (e.g., at node 415-*e*), for example, via a plate line as described with reference to FIG. 3. In such cases, the first supply voltage may represent a voltage for peripheral circuitry of the memory device. If switching component 405-*b* is activated (e.g., via a word line) the first supply voltage may be applied to respective first terminals (e.g., drains) of a first set of switching components 410-*c* of the load circuit (e.g., PMOS transistors). A third supply voltage may be applied to a second terminal of switching component 405-*c* (e.g., at node 415-*f*), for example, via a second plate line. In such cases, the third supply voltage may represent a negative supply terminal voltage. If switching component 405-*c* is activated (e.g., via a word line) the third supply voltage may be applied to respective second terminals (e.g., sources) of a second set of switching components 410-*d* of the load circuit (e.g., NMOS transistors).

A third set of switching components 410 (e.g., PMOS transistors) alternating with the first set of switching components 410-*c* may be directly coupled with the first supply voltage, such as via node 415-*e* (e.g., as illustrated in FIG. 4B). Similarly, a fourth set of switching components 410 (e.g., NMOS transistors) alternating with the second set of switching components 410-*d* may be directly coupled with the third supply voltage, such as via node 415-*f* (e.g., as illustrated in FIG. 4B). The third supply voltage may also be applied (e.g., without the use of drivers, or in a standby state) to node 415-*g* of circuit diagram 402.

In some examples, the terms first supply voltage and third supply voltage may be used interchangeably, such that the voltage for peripheral circuitry may be referred to as the third supply voltage and the negative supply terminal voltage may be referred to as the first supply voltage. In such cases, the peripheral circuitry voltage (e.g., third supply voltage) may still be applied at node 415-*e* and the negative supply terminal voltage (e.g., first supply voltage) may still be applied at node 415-*f*.

A second terminal (e.g., source) of each of the PMOS switching components 410 (e.g., the first and third sets of switching components) may be coupled with a respective first terminal (e.g., drain) of a respective NMOS switching component 410 (e.g., the second and fourth sets of switching components), and the first and second terminals that are coupled together may also be coupled with a respective gate of each of a following pair of switching components 410 (e.g., as illustrated in FIG. 4B). Accordingly, the load circuit illustrated by circuit diagram 402 may be configured to receive the first supply voltage via switching component 405-*b*, receive the third supply voltage via switching component 405-*c*, and apply the second supply voltage at a node 415-*h* of the load circuit. Node 415-*h* may be coupled with one or more components of the memory device, for example, to apply the second supply voltage to the one or more components.

The load circuit illustrated by circuit diagram 402 may be configured, for example, to reduce a current associated with the second supply voltage or associated with the load circuit. The reduction in current may be based on one or more constraints associated with an array of memory cells that includes the group of memory cells. For example, a scheme similar to that illustrated by circuit diagram 402 may be configured and the current may be reduced based on an availability or an amount of CMOS, PMOS, or NMOS devices in the memory array.

Circuit diagram 403 related to FIG. 4C may represent a power gating scheme that may also be referred to as an SCRC scheme. A switching component 405-*d* of the group of memory cells may be configured and used as a first driver for the load circuit represented by circuit diagram 403, and a switching component 405-*e* of the group of memory cells may be configured and used as a second driver for the load circuit. Switching components 405-*d* and 405-*e* may represent NMOS TFTs, for example, based on processing all (e.g., a top deck and a bottom deck) of the group of memory cells as NMOS TFTs.

The first supply voltage may be applied to a first terminal of switching component 405-*d* (e.g., at node 415-*i*), for example, via a plate line as described with reference to FIG. 3. The first supply voltage may represent a voltage for peripheral circuitry of the memory device. If switching component 405-*d* is activated (e.g., via a word line) the first supply voltage may be applied to respective first terminals (e.g., drains) of a first set of switching components 410-*e* of the load circuit (e.g., PMOS transistors). In some examples, a gate voltage of switching component 405-*d* may be overdriven (e.g., via the word line) in order to put circuit diagram 403 into effect and apply the first supply voltage. A third supply voltage may be applied to a second terminal of switching component 405-*e* (e.g., at node 415-*j*), for example, via a second plate line. The third supply voltage may represent a negative supply terminal voltage. If switching component 405-*e* is activated (e.g., via a word line) the third supply voltage may be applied to respective second terminals (e.g., sources) of a second set of switching components 410-*f* of the load circuit (e.g., NMOS transistors).

A third set of switching components 410 (e.g., PMOS transistors) alternating with the first set of switching components 410-*e* may be directly coupled with the first supply voltage, such as via node 415-*i* (e.g., as illustrated in FIG. 4C). Similarly, a fourth set of switching components 410 (e.g., NMOS transistors) alternating with the second set of switching components 410-*f* may be directly coupled with the third supply voltage, such as via node 415-*j* (e.g., as illustrated in FIG. 4C). The third supply voltage may also be directly applied to node 415-*k* of circuit diagram 403.

In some examples, the terms first supply voltage and third supply voltage may be used interchangeably, such that the voltage for peripheral circuitry may be referred to as the third supply voltage and the negative supply terminal voltage may be referred to as the first supply voltage. In such cases, the peripheral circuitry voltage (e.g., third supply voltage) may still be applied at node 415-*i* and the negative supply terminal voltage (e.g., first supply voltage) may still be applied at node 415-*j*.

A second terminal (e.g., source) of each of the PMOS switching components 410 (e.g., the first and third sets of switching components) may be coupled with a respective first terminal (e.g., drain) of a respective NMOS switching component 410 (e.g., the second and fourth sets of switching components), and the first and second terminals that are coupled together may also be coupled with a respective gate of each of a following pair of switching components 410 (e.g., as illustrated in FIG. 4C). Accordingly, the load circuit illustrated by circuit diagram 403 may be configured to receive the first supply voltage via switching component 405-*d*, receive the third supply voltage via switching component 405-*e*, and apply the second supply voltage at a node 415-*l* of the load circuit. In some examples, node 415-*l* may be coupled with one or more components of the memory device, for example, to apply the second supply voltage to the one or more components.

Figure 5:
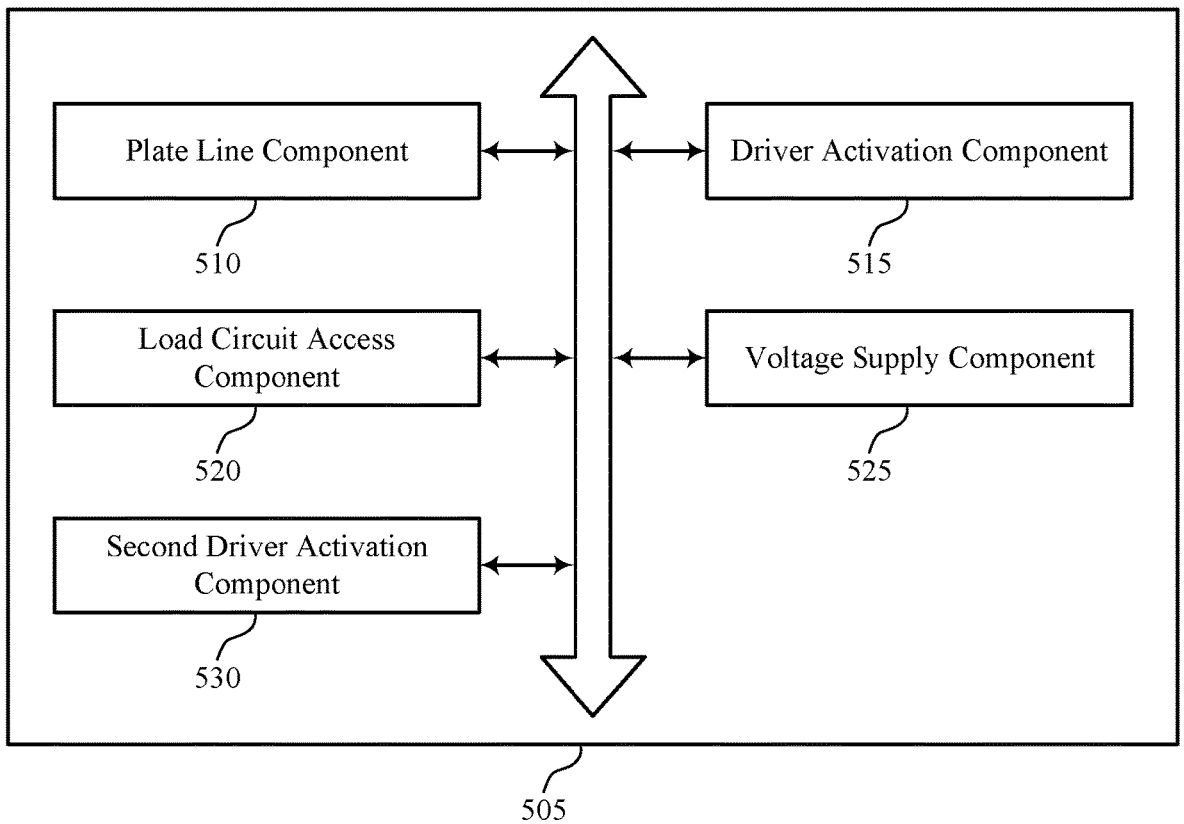
FIG. 5 shows a block diagram of a memory device that supports power gating in a memory device in accordance with aspects of the present disclosure.

FIG. 5 shows a block diagram 500 of a memory device 505 that supports power gating in a memory device in accordance with examples as disclosed herein. The memory device 505 may be an example of aspects of a memory device as described with reference to FIGS. 1-4. The memory device 505 may include a plate line component 510, a driver activation component 515, a load circuit access component 520, a voltage supply component 525, and a second driver activation component 530. Each of these modules may communicate, directly or indirectly, with one another (e.g., via one or more buses).

The plate line component 510 may apply a first supply voltage to a plate line of a memory device. In some examples, the first supply voltage includes a negative supply terminal voltage or a voltage for peripheral circuitry of the memory device.

The driver activation component 515 may activate a switching component to couple the plate line with a digit line, where activating the switching component applies the first supply voltage to the digit line.

The load circuit access component 520 may apply the first supply voltage to a load circuit including a set of switching components based on activating the switching component.

In some examples, the set of switching components includes a first set of switching components each including a PMOS and a second set of switching components each including an NMOS, where a terminal of each of the second set of switching components is coupled with a first terminal of a respective switching component of the first set of switching components. In some examples, the switching component includes a PMOS TFT, and a terminal of the switching component is coupled with a second terminal of each of the first set of switching components.

The voltage supply component 525 may apply a second supply voltage to one or more components of the memory device using the load circuit based on applying the first supply voltage to the load circuit. In some examples, the one or more components include a sense amplifier, a generator, power circuitry, or any combination thereof.

The second driver activation component 530 may apply a third supply voltage to a second plate line of the memory device. In some examples, the second driver activation component 530 may activate a second switching component to couple the second plate line with a second digit line, where activating the second switching component applies the third supply voltage to the second digit line. In some examples, the second driver activation component 530 may apply the third supply voltage to the load circuit based on activating the second switching component, where applying the second supply voltage to the one or more components of the memory device is based on applying the third supply voltage to the load circuit.

In some examples, a terminal of the switching component is coupled with a respective second terminal of each of a first subset of the first set of switching components and a terminal of the second switching component is coupled with a respective second terminal of each of a second subset of the second set of switching components. In some examples, the second switching component includes an NMOS TFT and the switching component includes a PMOS TFT or an NMOS TFT.

Figure 6:
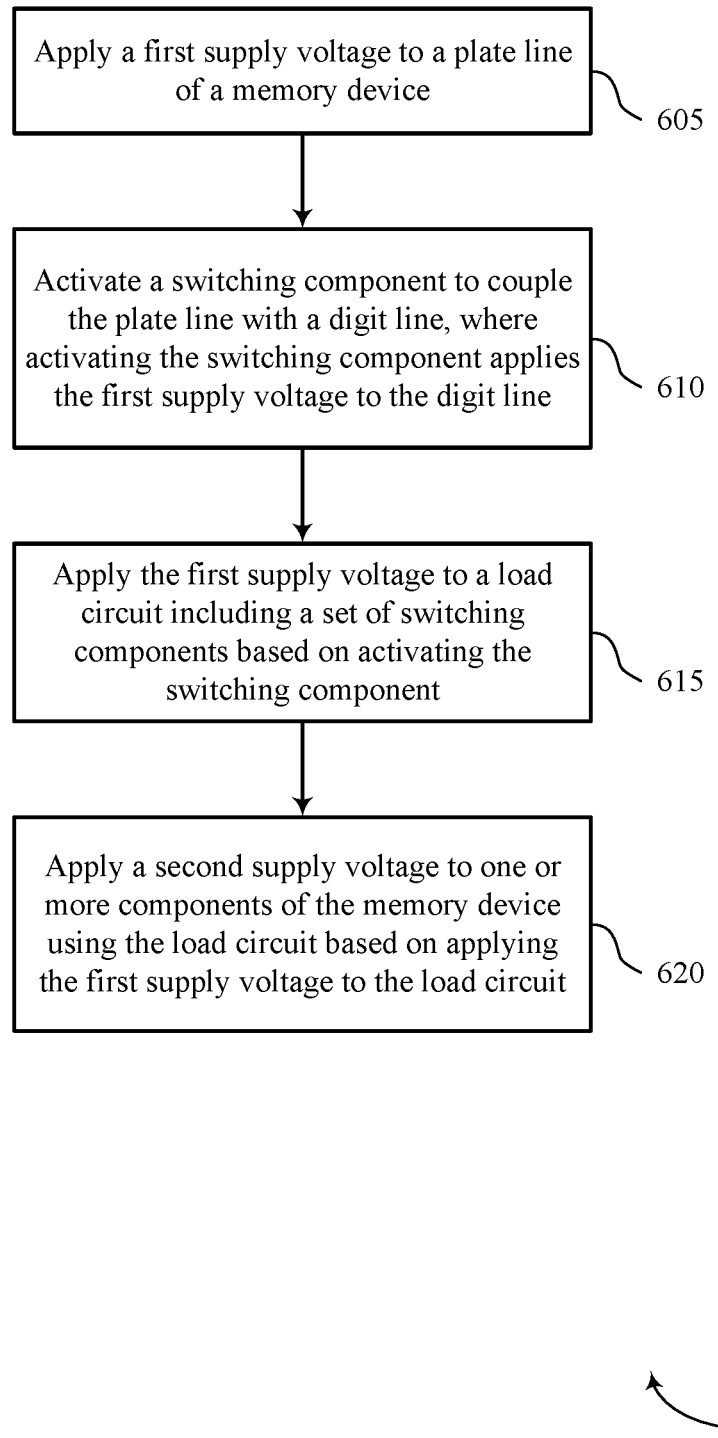
FIG. 6 shows a flowchart illustrating a method or methods that support power gating in a memory device in accordance with examples as disclosed herein.

FIG. 6 shows a flowchart illustrating a method or methods 600 that supports power gating in a memory device in accordance with aspects of the present disclosure. The operations of method 600 may be implemented by a memory device or its components as described herein. For example, the operations of method 600 may be performed by a memory device as described with reference to FIG. 5. In some examples, a memory device may execute a set of instructions to control the functional elements of the memory device to perform the described functions. Additionally or alternatively, a memory device may perform aspects of the described functions using special-purpose hardware.

At 605, the memory device may apply a first supply voltage to a plate line of a memory device. The operations of 605 may be performed according to the methods described herein. In some examples, aspects of the operations of 605 may be performed by a plate line component as described with reference to FIG. 5.

At 610, the memory device may activate a switching component to couple the plate line with a digit line, where activating the switching component applies the first supply voltage to the digit line. The operations of 610 may be performed according to the methods described herein. In some examples, aspects of the operations of 610 may be performed by a driver activation component as described with reference to FIG. 5.

At 615, the memory device may apply the first supply voltage to a load circuit including a set of switching components based on activating the switching component. The operations of 615 may be performed according to the methods described herein. In some examples, aspects of the operations of 615 may be performed by a load circuit access component as described with reference to FIG. 5.

At 620, the memory device may apply a second supply voltage to one or more components of the memory device using the load circuit based on applying the first supply voltage to the load circuit. The operations of 620 may be performed according to the methods described herein. In some examples, aspects of the operations of 620 may be performed by a voltage supply component as described with reference to FIG. 5.

In some examples, an apparatus as described herein may perform a method or methods, such as the method 600. The apparatus may include features, means, or instructions (e.g., a non-transitory computer-readable medium storing instructions executable by a processor) for applying a first supply voltage to a plate line of a memory device, activating a switching component to couple the plate line with a digit line, where activating the switching component applies the first supply voltage to the digit line, applying the first supply voltage to a load circuit including a set of switching components based on activating the switching component, and applying a second supply voltage to one or more components of the memory device using the load circuit based on applying the first supply voltage to the load circuit.

In some examples of the method 600 and the apparatus described herein, the set of switching components may include a first set of switching components each including a PMOS and a second set of switching components each including an NMOS, where a terminal of each of the second set of switching components may be coupled with a first terminal of a respective switching component of the first set of switching components.

In some examples of the method 600 and the apparatus described herein, the switching component includes a PMOS TFT, and a terminal of the switching component may be coupled with a second terminal of each of the first set of switching components. Some examples of the method 600 and the apparatus described herein may further include operations, features, means, or instructions for applying a third supply voltage to a second plate line of the memory device, activating a second switching component to couple the second plate line with a second digit line, where activating the second switching component applies the third supply voltage to the second digit line, and applying the third supply voltage to the load circuit based on activating the second switching component, where applying the second supply voltage to the one or more components of the memory device may be based on applying the third supply voltage to the load circuit.

In some examples of the method 600 and the apparatus described herein, a terminal of the switching component may be coupled with a respective second terminal of each of a first subset of the first set of switching components and a terminal of the second switching component may be coupled with a respective second terminal of each of a second subset of the second set of switching components. In some examples of the method 600 and the apparatus described herein, the second switching component includes an NMOS TFT and the switching component includes a PMOS TFT or an NMOS TFT.

In some examples of the method 600 and the apparatus described herein, the one or more components include a sense amplifier, a generator, power circuitry, or any combination thereof. In some examples of the method 600 and the apparatus described herein, the first supply voltage includes a negative supply terminal voltage or a voltage for peripheral circuitry of the memory device.

It should be noted that the methods described herein are possible implementations, and that the operations and the steps may be rearranged or otherwise modified and that other implementations are possible. Furthermore, portions from two or more of the methods may be combined.

An apparatus is described. The apparatus may include a plate line coupled with a voltage source having a first supply voltage, a switching component coupled with the plate line and a digit line, the switching component configured to selectively couple the plate line with the digit line to apply the first supply voltage to the digit line, and a set of switching components coupled with the digit line, the set of switching components configured to apply a second supply voltage to one or more components of the apparatus based on the first supply voltage being applied to the digit line.

Some examples of the apparatus may include a first group of memory cells each including a respective switching component and omitting a respective memory storage element, one of the first group of memory cells including the switching component, and a second group of memory cells each including a respective switching component and a respective memory storage element. In some examples, the first group of memory cells may be located at a first layer of the apparatus and the second group of memory cells may be located at a second layer of the apparatus. In some examples, the first group of memory cells may be located at a peripheral area of the apparatus.

Some examples of the apparatus may include one or more second digit lines each coupled with the digit line, and one or more second switching components each coupled with the plate line and with a respective second digit line, each second switching component configured to selectively couple the plate line with the respective second digit line to apply the first supply voltage to the respective second digit line.

In some examples, the set of switching components may include a first set of switching components each including a respective PMOS and a second set of switching components each including a respective NMOS, where a terminal of each of the second set of switching components may be coupled with a first terminal of a respective switching component of the first set of switching components. In some examples, the switching component includes a PMOS TFT, and a terminal of the switching component may be coupled with a second terminal of each of the first set of switching components. Some examples of the apparatus may include a second plate line coupled with a second voltage source having a third supply voltage, and a second switching component coupled with the second plate line and a second digit line, the second switching component including an NMOS TFT and configured to selectively couple the second plate line with the second digit line to apply the third supply voltage to the second digit line.

In some examples, the switching component includes a PMOS TFT, and a terminal of the switching component may be coupled with a second terminal of each of a first subset of the first set of switching components and a terminal of the second switching component may be coupled with a second terminal of each of a second subset of the second set of switching components. In some examples, the switching component includes an NMOS TFT, and a terminal of the switching component may be coupled with a second terminal of each of a first subset of the first set of switching components and a terminal of the second switching component may be coupled with a second terminal of each of a second subset of the second set of switching components.

Some examples of the apparatus may include a sense amplifier, a generator, and power circuitry, where the one or more components include the sense amplifier, the generator, the power circuitry, or any combination thereof. In some examples, the first supply voltage includes a negative supply terminal voltage or a voltage for peripheral circuitry of the apparatus. In some examples, the set of switching components includes one or more load circuits located at a MOS layer of the apparatus.

An apparatus is described. The apparatus may include a plate line, a digit line coupled with a load circuit including a set of switching components, a switching component coupled with the plate line and the digit line, the switching component configured to selectively couple the plate line with the digit line, and a controller coupled with the switching component and operable to cause the apparatus to apply a first supply voltage to the plate line, activate the switching component to apply the first supply voltage to the digit line, and apply a second supply voltage to one or more components of the apparatus based on activating the switching component.

Some examples of the apparatus may include a first group of memory cells each including a respective switching component and omitting a respective memory storage element, the first group of memory cells including the switching component, and a second group of memory cells each including a respective switching component and a respective memory storage element. Some examples of the controller may further be operable to apply the first supply voltage to the load circuit based on applying the first supply voltage to the digit line, where applying the second supply voltage to the one or more components may be based on applying the first supply voltage to the load circuit.

In some examples, the set of switching components may include a first set of switching components each including a respective PMOS and a second set of switching components each including a respective NMOS, where a terminal of each of the second set of switching components may be coupled with a first terminal of a respective switching component of the first set of switching components. In some examples, the switching component includes a PMOS TFT, and a terminal of the switching component may be coupled with a respective second terminal of each of the first set of switching components.

Some examples of the controller may further be operable to apply a third supply voltage to a second plate line of the memory device, activate a second switching component to couple the second plate line with a second digit line, where activating the second switching component applies the third supply voltage to the second digit line, and apply the third supply voltage to the load circuit based on activating the second switching component, where applying the second supply voltage to the one or more components of the memory device may be based on applying the third supply voltage to the load circuit. In some examples, a terminal of the switching component may be coupled with a respective second terminal of each of a first subset of the first set of switching components and a terminal of the second switching component may be coupled with a respective second terminal of each of a second subset of the second set of switching components.

In some examples, the second switching component includes an NMOS TFT and the switching component includes a PMOS TFT or an NMOS TFT. In some examples, the one or more components include a sense amplifier, a generator, power circuitry, or any combination thereof. In some examples, the first supply voltage includes a negative supply terminal voltage or a voltage for peripheral circuitry of the memory device.

An apparatus is described. The apparatus may include a set of first plate lines coupled with a first supply voltage, a set of first digit lines each coupled with a respective load circuit including a set of switching components, a set of first switching components each coupled with a respective plate line of the first plate lines and a respective digit line of the first digit lines and configured to selectively couple the respective plate line and the respective digit line to apply the first supply voltage to the respective digit line, where each load circuit is configured to apply a second supply voltage to one or more components of the apparatus based on the first supply voltage being applied to a corresponding digit line, a set of second plate lines each coupled with a first driver circuit for driving the respective second plate line to a plate voltage, a set of second digit lines each selectively couplable with a read circuit for reading a logic value stored at a memory cell, and a set of memory cells each coupled with a respective plate line of the second plate lines, each including a memory storage element and a second switching component, each second switching component configured to selectively couple a corresponding memory cell with a respective digit line of the second digit lines.

Some examples of the apparatus may include a set of second memory cells corresponding to the set of first plate lines and set of first digit lines, the set of second memory cells including the set of first switching components and each second memory cell of the set excluding a respective memory storage element. In some examples, the set of memory cells may be located at a first layer of the apparatus and the set of second memory cells may be located at a second layer of the apparatus. In some examples, the set of second memory cells may be located at a peripheral area of the apparatus. Some examples of the apparatus may include one or more electrode lines coupled with each of a subset of the set of digit lines, where each digit line of the subset may be coupled the other digit lines of the subset via the one or more electrode lines.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, and/or materials. In some examples, one layer or level may be composed of two or more sublayers or sublevels.

As used herein, the term "electrode" may refer to an electrical conductor, and in some examples, may be employed as an electrical contact to a memory cell or other component of a memory array. An electrode may include a trace, wire, conductive line, conductive layer, or the like that provides a conductive path between elements or components of the memory array.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of these are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
   a plurality of first plate lines coupled with a first supply voltage;
   a plurality of first switching components each coupled with a respective first plate line of the plurality of first plate lines and with a respective first digit line of a plurality of first digit lines, the plurality of first switching components configured to selectively couple the plurality of first plate lines with the plurality of first digit lines to apply the first supply voltage to the plurality of first digit lines; and
   a plurality of load circuits each comprising a plurality of second switching components coupled with the respective first digit line of the plurality of first digit lines and each configured to apply a second supply voltage to one or more components of the apparatus based at least in part on the first supply voltage being applied to the respective first digit line of the plurality of first digit lines.

2. The apparatus of claim 1, further comprising:
   a first group of memory cells each comprising a respective switching component, one memory cell of the first group of memory cells comprising a respective first switching component of the plurality of first switching components; and
   a second group of memory cells each comprising a second respective switching component of the plurality of second switching components and a respective memory storage element.

3. The apparatus of claim 2, wherein the first group of memory cells is located at a first layer of the apparatus and the second group of memory cells is located at a second layer of the apparatus.

4. The apparatus of claim 2, wherein the first group of memory cells is located at a peripheral area of the apparatus.

5. The apparatus of claim 1, further comprising:
   one or more second digit lines of a plurality of second digit lines each coupled with the respective first digit line of the plurality of first digit lines; and
   one or more third switching components of a plurality of third switching components each coupled with the respective first plate line of the plurality of first plate lines and with a respective second digit line of the plurality of second digit lines, each third switching component configured to selectively couple the respective first plate line of the plurality of first plate lines with the respective second digit line of the plurality of second digit lines to apply the first supply voltage to the respective second digit line of the plurality of second digit lines.

6. The apparatus of claim 1, wherein the plurality of first switching components comprises:
   a first set of switching components of the plurality of second switching components, each comprising a respective p-type metal oxide semiconductor; and
   a second set of switching components of the plurality of second switching components, each comprising a respective n-type metal oxide semiconductor, wherein a terminal of each of the second set of switching components is coupled with a first terminal of a respective switching component of the first set of switching components.

7. The apparatus of claim 6, wherein each first switching component of the plurality of first switching components comprises a p-type metal oxide semiconductor thin film transistor, and wherein a terminal of each first switching component is coupled with a second terminal of each of the first set of switching components.

8. The apparatus of claim 6, further comprising:
   a second plate line of a plurality of second plate lines coupled with a second voltage source having a third supply voltage; and
   a third switching component of a plurality of third switching components coupled with the second plate line of the plurality of second plate lines and a second digit line of a plurality of second digit lines, the third switching component comprising an n-type metal oxide semiconductor thin film transistor and configured to selectively couple the second plate line with the second digit line to apply the third supply voltage to the second digit line.

9. The apparatus of claim 8, wherein each first switching components of the plurality of first switching components comprises a p-type metal oxide semiconductor thin film transistor, and wherein a terminal of each first switching component is coupled with a second terminal of each of a first subset of the first set of switching components and a terminal of the third switching component is coupled with a second terminal of each of a second subset of the second set of switching components.

10. The apparatus of claim 8, wherein each first switching components of the plurality of first switching components comprises an n-type metal oxide semiconductor thin film transistor, and wherein a terminal of each first switching component is coupled with a second terminal of each of a first subset of the first set of switching components and a terminal of the third switching component is coupled with a second terminal of each of a second subset of the second set of switching components.

11. A method, comprising:
applying a first supply voltage to a first plate line of a plurality of plate lines of a memory device;
activating a first switching component of a plurality of first switching components to couple the first plate line of the plurality of plate lines with a first digit line of a plurality of first digit lines, wherein activating the first switching component of the plurality of first switching components comprises applying the first supply voltage to the first digit line of the plurality of first digit lines;
applying the first supply voltage to a respective load circuit of a plurality of load circuits, each load circuit comprising a plurality of second switching components based at least in part on activating the first switching component of the plurality of first switching components; and
applying a second supply voltage to one or more components of the memory device using the respective load circuit of the plurality of load circuits based at least in part on applying the first supply voltage to the respective load circuit of the plurality of load circuits.

12. The method of claim 11, wherein the plurality of second switching components comprises:
a first set of switching components each comprising a p-type metal oxide semiconductor; and
a second set of switching components each comprising an n-type metal oxide semiconductor, wherein a terminal of each of the second set of switching components is coupled with a first terminal of a respective switching component of the first set of switching components.

13. The method of claim 12, wherein the first switching component comprises a p-type metal oxide semiconductor thin film transistor, and wherein a terminal of the first switching component is coupled with a second terminal of each of the first set of switching components.

14. The method of claim 12, further comprising:
applying a third supply voltage to a second plate line of the memory device;
activating a third switching component to couple the second plate line with a second digit line, wherein activating the third switching component applies the third supply voltage to the second digit line; and
applying the third supply voltage to the respective load circuit based at least in part on activating the third switching component, wherein applying the second supply voltage to the one or more components of the memory device is based at least in part on applying the third supply voltage to the respective load circuit.

15. The method of claim 14, wherein a terminal of the first switching component is coupled with a respective second terminal of each of a first subset of the first set of switching components and a terminal of the third switching component is coupled with a respective second terminal of each of a second subset of the second set of switching components.

16. The method of claim 14, wherein the third switching component comprises an n-type metal oxide semiconductor thin film transistor and the first switching component comprises a p-type metal oxide semiconductor thin film transistor or an n-type metal oxide semiconductor thin film transistor.

17. An apparatus, comprising:
a plurality of first plate lines,
a plurality of first digit lines coupled with a respective load circuit of a plurality of load circuits, each load circuit comprising a plurality of second switching components,
a plurality of first switching components, each first switching component coupled with a respective first plate line of the plurality of first plate lines and a respective first digit line of the plurality of first digit lines, and each first switching component configured to selectively couple the respective first plate line with the respective first digit line, and
a controller coupled with each first switching component of the plurality of first switching components and operable to cause the apparatus to:
apply a first supply voltage to the respective first plate line of the plurality of first plate lines;
activate a first switching component of the plurality of first switching components to apply the first supply voltage to the respective first digit line of the plurality of first digit lines; and
apply a second supply voltage to one or more components of the apparatus based at least in part on activating the first switching component of the plurality of first switching components.

18. The apparatus of claim 17, further comprising:
a first group of memory cells each comprising a respective first switching component, one memory cell of the first group of memory cells comprising the first switching component; and
a second group of memory cells each comprising a respective second switching component and a respective memory storage element.

19. The apparatus of claim 17, wherein the controller is further operable to:
apply the first supply voltage to the respective load circuit based at least in part on applying the first supply voltage to the respective first digit line, wherein applying the second supply voltage to the one or more components is based at least in part on applying the first supply voltage to the respective load circuit.

20. The apparatus of claim 17, wherein the plurality of second switching components comprises:
a first set of switching components of the plurality of second switching components, each comprising a respective p-type metal oxide semiconductor; and
a second set of switching components of the plurality of second switching components, each comprising a respective n-type metal oxide semiconductor, wherein a terminal of each of the second set of switching components is coupled with a first terminal of a respective switching component of the first set of switching components.

* * * * *